United States Patent [19]

Robinson et al.

[11] 4,408,003
[45] Oct. 4, 1983

[54] VARNISHES FOR GLASSCLOTH LAMINATES, METHODS OF THEIR PRODUCTION AND LAMINATES MADE THEREFROM

[75] Inventors: Joseph G. Robinson, Winchcombe; Sally A. Brain, Evesham, both of England

[73] Assignee: Coal Industry (Patents) Limited, London, England

[21] Appl. No.: 311,647

[22] Filed: Oct. 15, 1981

[30] Foreign Application Priority Data

Nov. 7, 1980 [GB] United Kingdom ............. 8035809

[51] Int. Cl.$^3$ .................................................. C08K 5/07
[52] U.S. Cl. ............................ 524/364; 524/379; 428/273; 525/503
[58] Field of Search ............ 524/364, 379; 525/503; 428/273

[56] References Cited

U.S. PATENT DOCUMENTS 3,691,121 9/1972 Anderson et al. ............... 524/364

FOREIGN PATENT DOCUMENTS 17312 10/1980 European Pat. Off. .
2519406 11/1975 Fed. Rep. of Germany .
768699 2/1957 United Kingdom ............ 427/273

*Primary Examiner*—Joseph L. Schofer
*Assistant Examiner*—N. Sarofin
*Attorney, Agent, or Firm*—Stevens, Davis, Miller & Mosher

[57] ABSTRACT

The present invention relates to varnishes for use in the preparation of glasscloth laminates, methods of their production and laminates made therefrom.

The varnish is made by dissolving 100 parts of a TFP resin having a number average molecular weight of about 1000 and an oxygen content of about 8% in 60 to 65 parts of butan-2-one or isopropanol. 8 to 12 parts of hexamine are dissolved in a minimum quantity of a solvent comprising water and IMS in a ratio of about 3:5. The two solutions are thoroughly mixed and filtered to produce the varnish.

The varnish is used to prepare glasscloth laminates for use as printed circuit boards.

5 Claims, No Drawings

VARNISHES FOR GLASSCLOTH LAMINATES, METHODS OF THEIR PRODUCTION AND LAMINATES MADE THEREFROM

The present invention relates to varnishes for use in the preparation of glass cloth laminates, and also to methods of preparing the varnishes and to laminates made from the varnishes. In particular, the varnishes are prepared using toluene phenol formaldehyde (TFP) resins.

Several thermosetting resins have been developed which are stable at high temperatures (in the region from 200° to 250° C.) and which retain their mechanical properties at these temperatures. These resins include polymides, poly (amide-imides), polybenzimidazoles and polyphenylenes. These resins are derived from expensive materials and are difficult to make. They have limited commercial acceptability either because of their high cost or because their chemical or physical properties are not adequate for their intended use.

These resins are required in various industries to form relatively strong laminated materials which will withstand temperatures up to about 250° C. without significant loss of their physical properties.

In view of their commercial unacceptability, other resins have been proposed to replace them in the manufacture of laminates. For instance Friedel Crafts resins, such as Xylok 210 made by Albright and Wilson, have been used to form laminates. This resin is expensive, and it has been an object of our research to find a cheaper alternative. It was discovered that TFP resins appeared to have the requisite properties, as disclosed in our published European Patent application No. 0017312. This described a method of preparing a TFP resin suitable for various laminating and other uses.

However when this resin was used to prepare glass cloth laminates, it was found that the laminates cracked and blistered during either curing or post-curing of the laminates, thus rendering them technically unacceptable. Therefore, research work was undertaken with a view to producing acceptable glass cloth laminates using TFP resins as the bonding agents. It was discovered that this could be achieved only by use of carefully selected varnishes which had compositions falling within narrow limits. If the varnish's composition fell outside these limits, the laminates cracked and blistered or did not have adequate physical properties.

According to a first aspect of the invention, there is provided a varnish for the preparation of glass cloth laminates, comprising a mixture of a solution of 100 parts of a TFP resin having a number average molecular weight of about 1000 and an oxygen content of about 8% in from 60 to 65 parts of a $C_4$ to $C_6$ alkanone or a $C_3$ or $C_4$ alkanol, and a solution of from 8 to 12 parts of hexamethylene tetramine (hexamine) dissolved in a minimum amount of a solvent comprising water and a lower alkanol in a ratio of about 3:5.

According to a second aspect of the invention there is provided a method of preparing the varnish comprising dissolving 100 parts of the TFP resin defined above in from 60 to 65 parts of a $C_4$ to $C_6$ alkanone or a $C_3$ or $C_4$ alkanol, dissolving from 8 to 12 parts of hexamine in a minimum amount of a solvent comprising water and a lower alkanol in a ratio of about 3:5, and mixing the two solutions. Preferably, the mixture of the two solutions is filtered before it is used as a varnish.

According to a third aspect of the invention there is provided a glass cloth laminate made using the varnish according to the first aspect of the invention or made according to the second aspect of the invention.

Preferably, the TFP resin is made according to the method described in our previously mentioned European application, and therefore contains a small proportion of low molecular weight material. This component is able to wet the glasscloth substrate efficiently, enabling the laminate to be easily consolidated before it is cured. This results in a cured laminate of good thermal stability.

The alkanone may be 1,1-dimethylbutan-2-one or one of the pentanones, but is preferably butan-2-one. The $C_3$ or $C_4$ alkanol may be a propanol, and is preferably iso-propanol. The lower alkanol may be methanol, ethanol or a propanol, or mixtures of them, and is preferably industrial methylated spirit (IMS), which contains approximately 95% ethanol, 5% methanol and contaminant amounts of higher alcohols.

The critical factors in the varnish and its preparation are the choice of solvent for the resin, the concentration of resin in its solvent and the hexamine solution. It has been found that solvents usually used in resin varnishes such as ethanol or acetone cannot be used to form satisfactory laminates with the particular resin used in the present invention. If the concentration of resin in the solution is not within the given range either a weak laminate which tends to delaminate will be formed, or the glass cloth will not be fully impregnated by the varnish and the resin will not cure properly. It must be ensured that the hexamine is fully dissolved in the water-lower alkanol solvent and that as little of the solvent as possible is used. The hexamine must also be evenly distributed throughout the final varnish. If these points are not observed laminates formed using the varnish will crack or blister. This is thought to be due to the fact that only using the parameters specified in the present invention is it possible to ensure that volatiles formed during the curing are able to escape from the laminate and that the resin is properly cured. However we do not wish to be limited to this explanation which of itself forms no part of the invention.

The final laminates are envisaged as being useful as printed circuit boards and compressor blades for gas turbines.

In this specification and the claims all parts, percentages and ratios are by weight unless otherwise indicated.

The present invention will now be illustrated, by way of example only, with reference to three preparations.

Preparation 1—Varnish made According to the Prior Art

A toluene-formaldehyde condensation resin was made by charging water (3.4 kg) and 77% sulphuric acid (18.7 kg) to a stirred reactor. The temperature of the acid was raised to about 35° C. and paraform '87' (28.2 kg) was added. The reactor was heated to about 60° C. and toluene (25 kg) was added (Molar ratios: formaldehyde to toluene=3:1; sulphuric acid to toluene=0.54:1). The reactor was heated to 90° C. and the toluene/water azeotrope allowed to reflux in a vertical condenser. The temperature of the reaction mixture rose during the reaction to about 102° C. and was held at this temperature for 3 hours. The reactor was then cooled, the aqueous layer separated off and the condensation resin water-washed until neutral. The condensation resin has an oxygen content of 11% and a number average molecular weight of 440.

The condensation resin was then subjected to distillation for 8 hours at a pot temperature of 200° C. under a pressure of 20 mm Hg. to produce an intermediate resin as the residue.

The intermediate resin was phenolated with phenol itself as follows. Phenol (22.5 kg) and 100% para-toluene sulphonic acid (165 g) were charged to a heated reactor fitted with a reflux condenser. When the reactor temperature reached 85° C., the intermediate resin (27.5 kg), maintained at about 50° C. to keep the resin mobile, was slowly dripped into the reactor. The resin addition took approximately 1 hour. The temperature of the mixture rose to about 118° C. during the addition. After all the resin had been added, the mixture was heated to about 140° C. and superheated steam at about 150° C. was passed through it to raise the softening point of the phenolated resin. When the softening point of the resin was 105° C. (determined by the Ring and Ball method) the phenolated resin was allowed to cool and was dried. The phenolated resin had the properties given below:

Softening point:105° C.
Free Phenol Content:0.9%
Combined Phenol Content:48%
Oxygen Content:8.3%
Number average molecular weight:1050

The phenolated resin (100 parts) was then dissolved in sufficient IMS to give a 50% solution and hexamine (10 parts) (based on the weight of the phenolated resin) was added thereto. This provided a varnish which was used to make glasscloth laminates.

Five sheets, each 304 mm square were cut from a roll of glasscloth using a sharp knife. Each sheet was placed on a glass plate and about 40 g of varnish poured onto it. A hand roller was drawn across the sheet several times to ensure even impregnation of the fabric and to remove excess varnish.

The impregnated sheets were freely suspended and air dried for about 1 hour after which they were pre-cured for a fixed time in an air circulating oven at 135° C. Each sheet was cut into 4 equal squares and the 20 sheets thus obtained were stacked one of top of each other between plates lined with aluminum foil. The stack of sheets was pressed at 150° C. in a hydraulic press. The initial pressure was 3.4 $MN/mm^2$ which was allowed to fall progressively to 1.13 $MN/mm^2$ over the 1 hour dwell period. At the end of this time the laminate was cooled to room temperature while still under pressure (1.13 $MN/mm^2$) and thereafter removed for post-curing.

Rectangular test pieces 12.5 mm wide and of length approximately 27 times their thickness milled from the cured laminates were supported at one end and freely suspended in an air oven at 175° C. and post-cured as follows.

16 hours at 175° C.
4 hours from 175° C. to 200° C.
21 hours at 200° C.
8 hours from 200° C. to 250° C.

During either the curing or the post-curing of the laminates, blistering and cracking occurred, thereby rendering the artefacts unsuitable for most applications.

Preparation 2—According to the Invention

The method described in Preparation 1 was followed to produce a phenolated toluene formaldehyde (TFP) resin. The TFP resin (100 parts) was then dissolved in butane-2-one (63 parts). Hexamine (10 parts) was dissolved in a minimum amount of water, in this case 14 parts of water, and IMS (23 parts) was added. The hexamine solution was mixed thoroughly to ensure that all the hexamine was dissolved. The TFP resin solution and the hexamine solution were then mixed intimately and filtered through muslin to produce a first varnish according to the invention. The varnish was used to make glass cloth laminates.

Preparation 3—According to the Invention

A similar procedure to that described in the previous paragraph was carried out except that the resin solvent was isopropanol instead of butan-2-one. This produced a second varnish according to the invention.

The method of producing the laminates from the two varnishes according to the invention was the same as that described in Preparation 1, and included the same curing and post-curing schedule. At no time was there any evidence of cracking or blistering whichever varnish according to the invention was used and the laminates maintained their strength throughout the treatment period. Moreover, the cross-breaking strength of the laminates measured at 250° C. was relatively unchanged after ageing for up to 1000 h at 250° C.

The cross breaking strengths of the laminates were measured according to B.S. 2782, Method 304 B, 1970. The result of the measurements are given in the table below, in which comparable results for a laminate made with Xylok-210, a commercially available laminating resin, are also given.

| Resin | Cross-breaking Strength ($N/mm^2$) | |
|---|---|---|
| | After post curing schedule | After 1000 h at 250° C. |
| Preparation 2 | 160 | 220 |
| Preparation 3 | 175 | 240 |
| Xylok-210 | 150 | 260 |

It can thus be seen that glass cloth laminates made with varnishes according to the invention have equivalent properties to similar laminates made with a commercial resin, such as Xylok-210.

We claim:

1. A varnish for the preparation of glasscloth laminates, comprising a mixture of:
   a solution of 100 parts of a TFP resin having a number average molecular weight of about 1000 and an oxygen content of about 8% dissolved in a solvent selected from the group consisting of $C_4$ to $C_6$ alkanones and $C_3$ or $C_4$ alkanols; and
   a solution of from 8 to 12 parts of hexamine dissolved in a minimum amount of a solvent comprising water and a lower alkanol in a ratio of about 3:5.

2. A varnish according to claim 1, wherein the TFP resin contains a small proportion of low molecular weight material.

3. A varnish according to claim 1, wherein the resin solvent is butan-2-one.

4. A varnish according to claim 1, wherein the resin solvent is iso-propanol.

5. A varnish according to claim 1, wherein the lower alkanol in the hexamine solvent is IMS.

* * * * *